(12) United States Patent
Park et al.

(10) Patent No.: US 11,345,998 B2
(45) Date of Patent: May 31, 2022

(54) DEPOSITION APPARATUS INCLUDING UPPER SHOWER HEAD AND LOWER SHOWER HEAD

(71) Applicant: Samsung Electronics Co., Ltd., Suwon-si (KR)

(72) Inventors: Byung Sun Park, Suwon-si (KR); Ji Youn Seo, Seoul (KR); Ji Woon Im, Hwaseong-si (KR); Hyun Seok Lim, Suwon-si (KR); Byung Ho Chun, Seongnam-si (KR); Yu Seon Kang, Hwaseong-si (KR); Hyuk Ho Kwon, Hwaseong-si (KR); Sung Jin Park, Seongnam-si (KR); Tae Yong Eom, Anyang-si (KR); Dong Hyeop Ha, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 322 days.

(21) Appl. No.: 15/988,067

(22) Filed: May 24, 2018

(65) Prior Publication Data

US 2019/0145001 A1    May 16, 2019

(30) Foreign Application Priority Data

Nov. 16, 2017 (KR) .................. 10-2017-0153001

(51) Int. Cl.
*C23C 16/455* (2006.01)
*H01J 37/32* (2006.01)
*H01L 21/02* (2006.01)

(52) U.S. Cl.
CPC .... *C23C 16/45565* (2013.01); *H01J 37/3244* (2013.01); *H01J 37/32082* (2013.01);
(Continued)

(58) Field of Classification Search
CPC .............. H01J 37/32; H01J 37/32082; H01J 37/32091; H01J 37/32366;
(Continued)

(56) References Cited

U.S. PATENT DOCUMENTS 5,304,248 A    4/1994 Cheng et al.
5,474,612 A *  12/1995 Sato .................... H01L 21/6875
                                                       118/728
(Continued)

FOREIGN PATENT DOCUMENTS

CN    101448977 A    6/2009
CN    102084461 A    6/2011
(Continued)

OTHER PUBLICATIONS

Search and Written Opinion issued by the Intellectual Property Office of Singapore dated Jul. 26, 2018 Corresponding Application No. SG 10201804986W.
(Continued)

*Primary Examiner* — Benjamin Kendall
*Assistant Examiner* — Kurt Sweely
(74) *Attorney, Agent, or Firm* — Lee IP Law, P.C.

(57) ABSTRACT

A deposition apparatus includes an upper shower head and a lower shower head within a process chamber, the upper shower head and the lower shower head facing each other, a support structure between the upper shower head and the lower shower head, the support structure being connected to the lower shower head to support a wafer, and a plasma process region between the wafer supported by the support structure and the lower shower head, wherein the lower shower head includes lower holes to jet a lower gas in a direction of the wafer, wherein the upper shower head includes upper holes to jet an upper gas in a direction of the wafer, and wherein the support structure includes through
(Continued)

opening portions to discharge a portion of the lower gas jetted through the lower holes to a space between the support structure and the upper shower head.

20 Claims, 9 Drawing Sheets

(52) U.S. Cl.
CPC .. *H01J 37/32458* (2013.01); *H01J 37/32642* (2013.01); *H01J 37/32724* (2013.01); *H01L 21/02274* (2013.01)

(58) Field of Classification Search
CPC ........... H01J 37/32403; H01J 37/32431; H01J 37/3244; H01J 37/32449; H01J 37/32513; H01J 37/32623; H01J 37/32633; H01J 37/32642; H01J 37/32651; H01J 37/32715; H01J 37/32752; H01J 37/32458; H01J 37/32724; H01L 21/67; H01L 21/67063; H01L 21/67069; H01L 21/683; H01L 21/687; H01L 21/68735; H01L 21/68742; H01L 21/68785; H01L 21/02274; C23C 14/50; C23C 16/45502; C23C 16/45508; C23C 16/45517; C23C 16/45563; C23C 16/4557; C23C 16/4558; C23C 16/45587; C23C 16/45589; C23C 16/45591; C23C 16/45597; C23C 16/458; C23C 16/4582; C23C 16/4583; C23C 16/4585; C23C 16/505; C23C 16/509
See application file for complete search history.

(56) References Cited

U.S. PATENT DOCUMENTS

| | | | |
|---|---|---|---|
| 5,620,525 A * | 4/1997 | van de Ven | C23C 16/04 118/724 |
| 6,159,299 A | 12/2000 | Koai et al. | |
| 6,296,712 B1 | 10/2001 | Guo et al. | |
| 6,464,794 B1 * | 10/2002 | Park | C23C 16/4583 118/724 |
| 6,565,661 B1 * | 5/2003 | Nguyen | C23C 16/45565 118/715 |
| 7,048,488 B1 * | 5/2006 | Kuznetsov | H01L 21/67784 414/152 |
| 7,198,677 B2 * | 4/2007 | Yoo | C23C 16/0236 118/715 |
| 8,373,086 B2 * | 2/2013 | Kim | H01J 37/32009 118/729 |
| 8,721,833 B2 | 5/2014 | Chen et al. | |
| 8,852,349 B2 | 10/2014 | Chacin et al. | |
| 8,865,602 B2 | 10/2014 | Ranish et al. | |
| 9,412,579 B2 | 8/2016 | Sadjadi et al. | |
| 9,428,833 B1 | 8/2016 | Duvall et al. | |
| 9,558,982 B2 | 1/2017 | Pan et al. | |
| 2003/0201069 A1 | 10/2003 | Johnson | |
| 2005/0098111 A1 | 5/2005 | Shimizu et al. | |
| 2008/0066684 A1 * | 3/2008 | Patalay | H01L 21/68735 118/728 |
| 2009/0258142 A1 * | 10/2009 | An | C23C 14/50 427/255.6 |
| 2009/0291209 A1 * | 11/2009 | Granneman | C23C 16/458 118/718 |
| 2010/0132614 A1 | 6/2010 | Kato et al. | |
| 2010/0175622 A1 | 7/2010 | Yoon et al. | |
| 2010/0203736 A1 | 8/2010 | Ichino et al. | |
| 2011/0049100 A1 * | 3/2011 | Han | H01L 21/68785 216/67 |
| 2012/0211486 A1 | 8/2012 | Kasai et al. | |
| 2013/0105303 A1 | 5/2013 | Lubomirsky et al. | |
| 2013/0203258 A1 | 8/2013 | Chen et al. | |
| 2014/0113458 A1 | 4/2014 | Pan et al. | |
| 2014/0118751 A1 | 5/2014 | Rajagopalan et al. | |
| 2015/0020848 A1 * | 1/2015 | Kim | H01L 21/0209 134/1.2 |
| 2015/0083333 A1 | 3/2015 | Kikuchi et al. | |
| 2015/0129130 A1 | 5/2015 | Cheng | |
| 2015/0340225 A1 | 11/2015 | Kim et al. | |
| 2016/0035566 A1 | 2/2016 | LaVoie et al. | |
| 2016/0172165 A1 | 6/2016 | Jeon et al. | |
| 2016/0340781 A1 | 11/2016 | Thomas et al. | |
| 2016/0340782 A1 | 11/2016 | Chandrasekharan et al. | |
| 2016/0348244 A1 | 12/2016 | Saabri et al. | |
| 2016/0351378 A1 | 12/2016 | Kishi et al. | |
| 2017/0167024 A1 | 6/2017 | Wiltse et al. | |

FOREIGN PATENT DOCUMENTS

| | | |
|---|---|---|
| CN | 105316651 A | 2/2016 |
| EP | 1134791 A2 | 9/2001 |
| JP | 2002-9136 A | 1/2002 |
| JP | 4365226 B2 | 8/2009 |
| JP | 2013191782 A | 9/2013 |
| JP | 2014-212245 A | 11/2014 |
| KR | 10-2001-0076521 A | 8/2001 |
| KR | 10-2009-0024522 A | 3/2009 |
| KR | 10-2009-0057840 A | 6/2009 |
| KR | 10-2009-0106730 A | 10/2009 |
| KR | 10-0990746 B1 | 10/2010 |
| KR | 10-2012-0036464 A | 4/2012 |
| KR | 10-2014-0011364 A | 1/2014 |
| KR | 2014-0045806 A | 4/2014 |
| KR | 10-1432157 B1 | 8/2014 |
| KR | 2014-0100764 A | 8/2014 |
| KR | 2015-0074073 A | 7/2015 |
| KR | 2015-0139774 A | 12/2015 |
| KR | 10-2016-0137403 A | 11/2016 |
| KR | 10-2016-0137404 A | 11/2016 |
| KR | 2016-0140450 A | 12/2016 |
| KR | 10-2017-0074755 A | 6/2017 |
| WO | WO 2007/142690 A2 | 12/2007 |
| WO | WO 2010/003093 A2 | 1/2010 |
| WO | WO 2014/123310 A1 | 8/2014 |

OTHER PUBLICATIONS

Examination Report of the Indian application No. 20182403674.
Provisional double patenting rejection over claims of the above-identified application; USPTO Office action dated Apr. 24, 2020, in U.S. Appl. No. 15/993,752.
USPTO Office action dated Sep. 28, 2020 in U.S. Appl. No. 15/993,752.
Chinese Office action dated Jan. 25, 2022 for corresponding CN 201811267563.1.

* cited by examiner

DEPOSITION APPARATUS INCLUDING UPPER SHOWER HEAD AND LOWER SHOWER HEAD

CROSS-REFERENCE TO RELATED APPLICATION

Korean Patent Application No. 10-2017-0153001, filed on Nov. 16, 2017, in the Korean Intellectual Property Office, and entitled: "Deposition Apparatus Including Upper Shower Head and Lower Shower Head," is incorporated by reference herein in its entirety.

BACKGROUND

1. Field

The present disclosure relates to a deposition apparatus, and more particularly, to a deposition apparatus including an upper shower head and a lower shower head.

2. Description of the Related Art

In general, integrated circuits (ICs) are formed on the front surface of a semiconductor wafer. Such ICs may be formed by repeating semiconductor fabrication processes, e.g., a deposition process, a photolithography process, and an etching process, on the front surface of the semiconductor wafer.

SUMMARY

According to an aspect of the present disclosure, a deposition apparatus is provided. The deposition apparatus includes an upper shower head and a lower shower head disposed within a process chamber, and facing each other, a support structure disposed between the upper shower head and the lower shower head, connected to the lower shower head, and supporting a wafer, and a plasma process region disposed between the wafer supported by the support structure and the lower shower head. The lower shower head includes lower holes for jetting a lower gas in a direction of the wafer, the upper shower head includes upper holes for jetting an upper gas in a direction of the wafer, and the support structure includes through opening portions for discharging a portion of the lower gas jetted through the lower holes into a space between the support structure and the upper shower head.

According to another aspect of the present disclosure, a deposition apparatus is provided. The deposition apparatus includes a lower shower head, an upper shower head disposed on the lower shower head, a support structure disposed between the upper shower head and the lower shower head, connected to the lower shower head, and supporting a wafer, and a plasma process region disposed between the wafer supported by the support structure and the lower shower head. The lower shower head includes lower holes for jetting a plasma process source gas in a direction of the wafer, the upper shower head includes upper holes for jetting a purge gas in a direction of the wafer, and the support structure includes through opening portions for discharging a portion of the plasma process source gas jetted through the lower holes into a space between the support structure and the upper shower head.

According to yet another aspect of the present disclosure, a deposition apparatus is provided. The deposition apparatus includes a lower shower head disposed within a process chamber, an upper shower head disposed within the process chamber, and facing the lower shower head, a support structure disposed between the upper shower head and the lower shower head, connected to the lower shower head, and supporting a wafer, a metal ring disposed on an inner wall of the process chamber, and surrounding at least a portion of the support structure, and a variable capacitor disposed externally of the process chamber, and electrically connected to the metal ring.

BRIEF DESCRIPTION OF DRAWINGS

Features will become apparent to those of skill in the art by describing in detail example embodiments with reference to the attached drawings, in which.

DETAILED DESCRIPTION

A deposition apparatus, according to an example embodiment, will be described hereinafter, with reference to the accompanying drawings.

Figure 1:
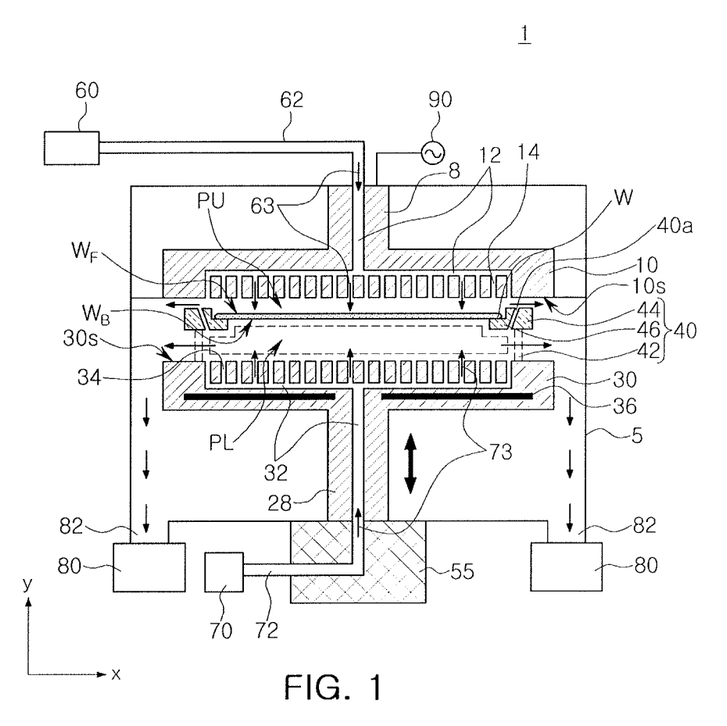
FIG. 1 illustrates a conceptual cross-sectional view of a deposition apparatus, according to an example embodiment.
Figure 2:
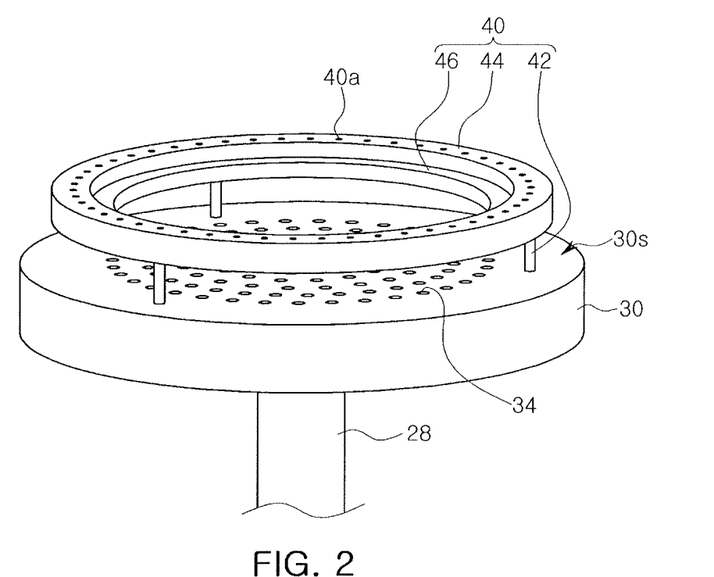
FIG. 2 illustrates a conceptual perspective view of a portion of a deposition apparatus, according to an example embodiment.
Figure 3:
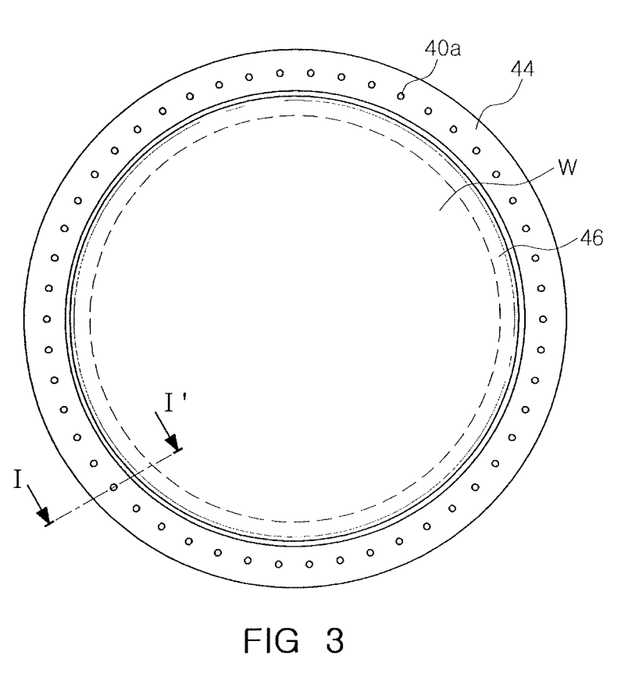
FIG. 3 illustrates a plan view of a portion of a deposition apparatus, according to an example embodiment.
Figure 5A:
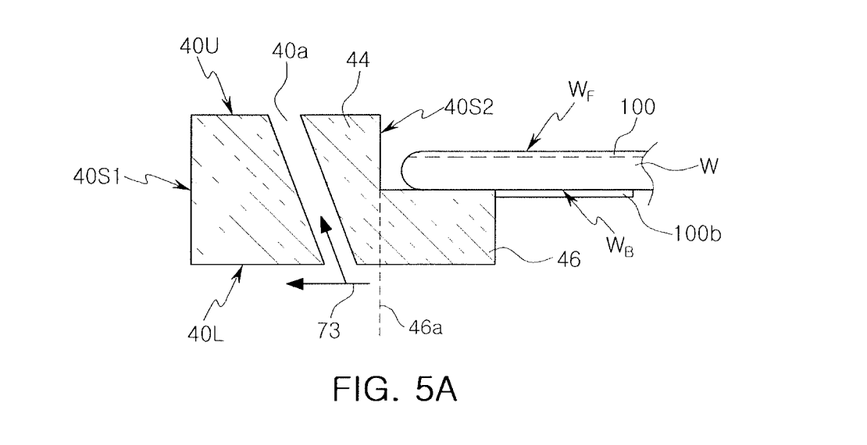
FIG. 5A illustrates a cross-sectional view of a portion of a deposition apparatus, according to an example embodiment.

A deposition apparatus, according to an example embodiment, will be described, with reference to FIGS. 1 to 3, and 5A. FIG. 1 is a conceptual cross-sectional view illustrating an example of a deposition apparatus 1, according to an example embodiment; FIG. 2 is a perspective view conceptually illustrating a lower shower head 30 and a support structure 40 of the deposition apparatus 1, according to an example embodiment; FIG. 3 is a plan view conceptually illustrating the support structure 40 of the deposition apparatus 1, supporting a wafer W, according to an example embodiment; and FIG. 5A is a cross-sectional view taken along line I-I' of FIG. 3.

Referring to FIGS. 1, 2, 3, and 5A, the deposition apparatus 1, according to an example embodiment, may include a process chamber 5, an upper shower head 10 and the lower shower head 30 disposed within the process chamber 5 to face each other, and the support structure 40 disposed between the upper shower head 10 and the lower shower head 30 to support the wafer W. For example, as illustrated in FIG. 1, only edges of the wafer W may be supported by the support structure 40, with both front and rear surfaces $W_F$ and $W_B$ of the wafer W being exposed and facing the upper shower head 10 and the lower shower head 30, respectively.

The deposition apparatus 1, according to an example embodiment, may further include an upper gas supply part 60 and an upper gas pipe 62, through which an upper gas 63 supplied from the upper gas supply part 60 may move into the process chamber 5. The deposition apparatus 1, according to an example embodiment, may further include a lower gas supply part 70 and a lower gas pipe 72, through which a lower gas 73 supplied from the lower gas supply part 70 may move into the process chamber 5. The deposition apparatus 1, according to an example embodiment, may further include a radio frequency (RF) power supply part 90 generating plasma within the process chamber 5.

In detail, the upper shower head 10 may be disposed above the lower shower head 30. The upper shower head 10 may have an upper head surface 10s, and the lower shower head 30 may have a lower head surface 30s facing the upper head surface 10s. In an example, an upper support portion 8 may fix the upper shower head 10 to the process chamber 5.

The upper shower head 10 may have an upper flow path 12 therein. The upper flow path 12 may extend into the upper support portion 8 to connect to the upper gas pipe 62. For example, as illustrated in FIG. 1, the upper flow path 12 may include a first channel extending vertically, e.g., along the y direction, through the upper support portion 8, and a second channel extending horizontally, e.g., along the x direction, through the upper shower head 10, e.g., the first and second channels of the upper flow path 12 may be connected to each other and in fluid communication with each other.

The upper shower head 10 may include upper holes 14 for jetting, e.g., discharging, the upper gas 63 in a direction of the wafer W. The upper holes 14 may extend internally in the upper shower head 10 from the upper head surface 10s to connect to the upper flow path 12. For example, as illustrated in FIG. 1, the upper head surface 10s of the upper shower head 10 may be a substantially flat surface in the xz plane, with the upper holes 14 extending in the y direction from the horizontal portion of the upper flow path 12 to the upper head surface 10s, e.g., the upper holes 14 may extend through the upper head surface 10s to define a flow path in fluid communication with the upper flow path 12. Thus, the upper gas 63 supplied from the upper gas supply part 60 may be jetted onto the front surface $W_F$ of the wafer W supported by the support structure 40 through the upper gas pipe 62, the upper flow path 12, and the upper holes 14 in turn. The wafer W may have the front surface $W_F$ facing the upper shower head 10, and the rear surface $W_B$ facing the lower shower head 30.

The lower shower head 30 may have a lower flow path 32 therein. The lower flow path 32 may extend into a lower shaft 28 and into a lower structure 55 disposed below the lower shaft 28 to connect to the lower gas pipe 72. For example, as illustrated in FIG. 1, the lower flow path 32 may include a first channel extending vertically, e.g., along the y direction, through the lower shaft 28 and into the lower structure 55, and a second channel extending horizontally, e.g., along the x direction, through the lower shower head 30, e.g., the first and second channels of the lower flow path 32 may be connected to each other and in fluid communication with each other. The lower shaft 28 may move the lower shower head 30 and the support structure 40 in a vertical direction, e.g., along the y direction. The lower shaft 28 may also be moved in the vertical direction by the lower structure 55 disposed below the lower shaft 28.

The lower shower head 30 may include lower holes 34 for jetting the lower gas 73 in a direction of the wafer W. The lower holes 34 may extend internally in the lower shower head 30 from the lower head surface 30s to connect to the lower flow path 32. For example, as illustrated in FIG. 1, the lower head surface 30s of the lower shower head 30 may be a substantially flat surface in the xz plane, with the lower holes 34 extending in the y direction from a horizontal portion of the lower flow path 32 to the lower head surface 30s, e.g., the lower holes 34 may extend through the lower head surface 30s to define a flow path in fluid communication with the lower flow path 32. Thus, the lower gas 73 supplied from the lower gas supply part 70 may be jetted onto the rear surface $W_B$ of the wafer W through the lower flow path 32 and the lower holes 34 of the lower shower head 30 in turn.

While RF power is supplied to the RF power supply part 90, plasma PL may be generated by the lower gas 73 between the rear surface $W_B$ of the wafer W and the lower shower head 30 (dashed frame between the rear surface $W_B$ and the lower shower head 30 in FIG. 1). In detail, plasma generated by the lower gas 73 may be used to deposit, e.g., via chemical vapor deposition (CVD), a rear reinforcing film 100b, e.g., a silicon oxide film or a silicon nitride film, on the rear surface $W_B$ of the wafer W (FIG. 5A). In an example, the lower gas 73 may be a plasma process source gas that may be used to form a silicon oxide film or a silicon nitride film by a plasma process. A front pattern 100 may be formed on the front surface $W_F$ of the wafer W to form a semiconductor integrated circuit (IC), as illustrated in FIG. 5A. The rear reinforcing film 100b formed on the rear surface $W_B$ of the wafer W may significantly reduce a warpage phenomenon of the wafer W.

A region in which plasma may be generated by the lower gas 73 may be defined as a "plasma process region PL." The plasma process region PL may be formed between the wafer W supported by support structure 40 and the lower shower head 30. The plasma process region PL may also be formed between the wafer W and the lower shower head 30, and may extend to a space between the lower shower head 30 and the support structure 40.

The upper gas 63 may be supplied from the upper gas supply part 60 and jetted to an upper purge region PU on the front surface $W_F$ of the wafer W through the upper holes 14 of the upper shower head 10. The upper gas 63 may be a purge gas by which plasma may not be generated, even when RF power is supplied to the RF power supply part 90. For example, the upper gas 63 may be a purge gas, e.g., nitrogen. The upper purge region PU may prevent plasma generated in the plasma process region PL from being deposited onto the front surface $W_F$ of the wafer W. Thus, the upper purge region PU may prevent the front surface $W_F$ of the wafer W from being damaged or contaminated.

In an example embodiment, the upper gas 63 and the lower gas 73 jetted to a space between the upper shower head 10 and the lower shower head 30 may be discharged through a discharge portion 82 disposed in a lower region of the process chamber 5. The discharge portion 82 may connect to a vacuum pump 80, and the upper gas 63 and the lower gas 73 may be discharged by vacuum intake force generated by the vacuum pump 80.

In an example, the support structure 40 may couple to the lower shower head 30, as illustrated in FIG. 2, and may be spaced apart from the upper shower head 10, as illustrated in FIG. 1. The support structure 40 may include a ring body 44 surrounding the wafer W, a plurality of ring support shafts 42 extending downwardly from the ring body 44 to connect to the lower shower head 30, and a wafer support portion 46 extending from a lower region of the ring body 44 in a direction internally of the ring body 44 to support the wafer W. The support structure 40 may further include through opening portions 40a for discharging a portion of the lower gas 73 jetted through the lower holes 34 into a space between the support structure 40 and the upper shower head 10, e.g., the through opening portions 40a may be spaced apart from each other along a perimeter of the ring body 44.

In detail, as illustrated in FIGS. 1 and 5A, the through opening portions 40a may pass through the ring body 44 of the support structure 40. The through opening portions 40a may pass through from an upper surface 40U of the ring body 44 to a lower surface 40L of the ring body 44 (FIG. 5A). The through opening portions 40a may be closer to an outer surface 40S1 of the ring body 44 than to an inner surface 40S2 of the ring body 44 from the lower surface 40L of the ring body 44 toward the upper surface 40U thereof.

A portion of each of the through opening portions 40a, passing through the upper surface 40U of the ring body 44, may be closer to the outer surface 40S1 of the ring body 44 than to a portion of the through opening portion 40a, passing through the lower surface 40L of the ring body 44. In other words, as illustrated in FIGS. 1 and 5A, a distance between the outer surface 40S1 of the ring body 44 and the opening portions 40a, e.g., along a radial direction with respect to the lower shaft 28, may decrease, as a distance from the upper surface 40U of the ring body 44 decreases, e.g., the through opening portions 40a may be inclined to have an obtuse angle between the through opening portions 40a and the rear surface Wb of the wafer W.

A portion of the lower gas 73 may be discharged through the through opening portions 40a, and the remainder of the lower gas 73 may be discharged through a space between the ring body 44 and the lower shower head 30. Since the through opening portions 40a may be inclined in a direction toward the outer surface 40S1 of the ring body 44 from the inner surface 40S2 of the ring body 44, the lower gas 73 discharged through the through opening portions 40a may not move onto the front surface $W_F$ of the wafer W, and may move toward the discharge portion 82 through a space between the upper surface 40U of the ring body 44 of the support structure 40 and the upper shower head 10. The through opening portions 40a may serve to protect the front surface $W_F$ of the wafer W from plasma generated in the plasma process region PL, together with the upper purge region PU.

Thus, the deposition apparatus 1, according to an example embodiment, may perform a deposition process for forming the rear reinforcing film 100b on the rear surface $W_B$ of the wafer W supported by the support structure 40, while protecting the front surface $W_F$ of the wafer W. The rear reinforcing film 100b (FIG. 5A) may significantly reduce the warpage of the wafer W.

For example, as illustrated in FIG. 3, each of the through opening portions 40a may be circular in top view. However, example embodiments are not limited thereto.

Figure 4:
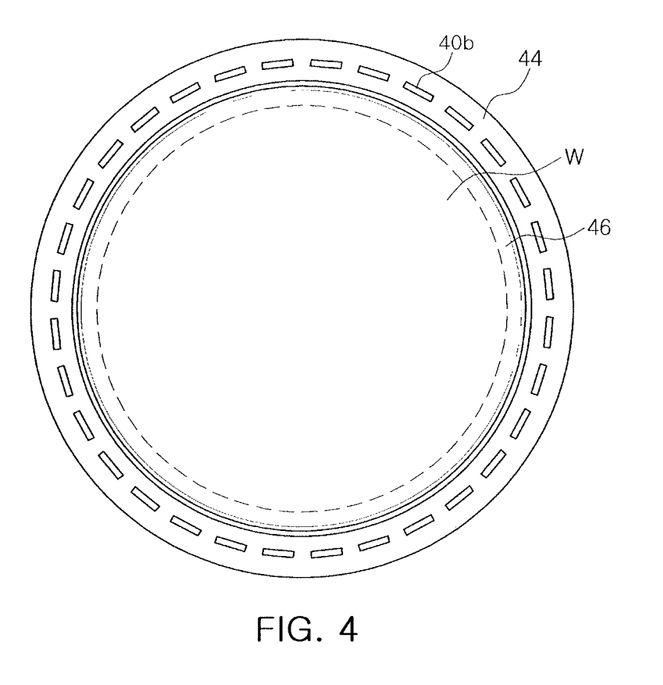
FIG. 4 illustrates a plan view of a modified example of a portion of a deposition apparatus, according to an example embodiment.

A modified example of the through opening portion will be described with reference to FIG. 4. FIG. 4 is a plan view illustrating the support structure 40 supporting the wafer W to illustrate the modified example of the through opening portion.

Referring to FIG. 4, each of through opening portions 40b may have an elongated bar or oval shape in top view. For example, the through opening portions 40b may have a bar shape with a length along a perimeter of the ring body 44 that is greater than its width along a radial direction (i.e., toward a center) of the ring body 44. The cross sectional structure of the opening portions 40b may be the same as that of the through opening portions 40a in FIGS. 1-3, e.g., the inclined structure.

Referring again to FIGS. 1, 2, 3, and 5A, each through opening portion 40a may extend from a central portion of the upper surface 40U of the ring body 44 to the lower surface 40L of the ring body 44. For example, as illustrated in FIG. 3, each through opening portion 40a may be centered on the upper surface 40U of the ring body 44 in top view, e.g., positioned equidistantly relatively to the outer and inner surfaces 40S1 and 40S2 in top view (FIG. 5A). However, example embodiments are not limited thereto.

Figure 5B:
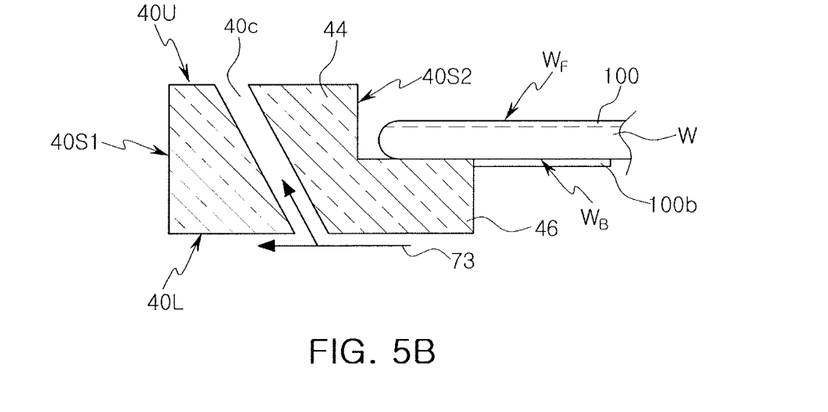
FIG. 5B illustrates a cross-sectional view of a modified example of a portion of a deposition apparatus, according to an example embodiment.

A modified example of the through opening portion will be described with reference to FIG. 5B. FIG. 5B is a cross-sectional view conceptually illustrating a modified example of the support structure 40 supporting the wafer W.

Referring to FIG. 5B, a portion of each of through opening portions 40c, passing through the upper surface 40U of the ring body 44, may be biased from the central portion of the upper surface 40U toward the outer surface 40S1 of the ring body 44, as view in a top view. Thus, the portion of the through opening portion 40a, passing through the upper surface 40U of the ring body 44, may be closer to the outer surface 40S1 of the ring body 44 than to the inner surface 40S2 of the ring body 44. In other words, as illustrated in FIG. 5B, each through opening portion 40c may be positioned to be closer to the outer surface 40S1 than to the inner surface 40S2, in top view, while having a same cross-sectional structure described with reference to FIGS. 1-3.

Referring again to FIGS. 1, 2, 3, and 5A, each through opening portion 40a may pass through the ring body 44, and may be, e.g., horizontally, spaced apart from an imaginary interface 46a between the ring body 44 and the wafer support portion 46, e.g., the ring body 44 and the wafer support portion 46 may be integral with each other to define a single and seamless structure. However, example embodiments are not limited thereto.

Figure 5C:
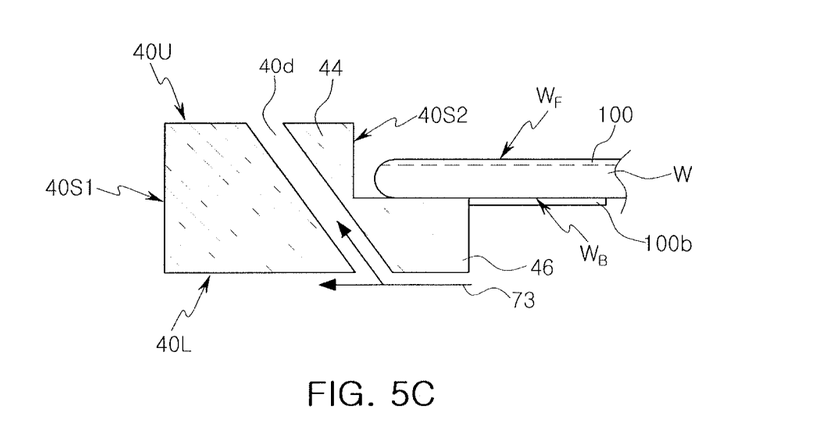
FIG. 5C illustrates a cross-sectional view of a modified example of a portion of a deposition apparatus, according to an example embodiment.

A modified example of the through opening portion will be described with reference to FIG. 5C. FIG. 5C is a cross-sectional view conceptually illustrating a modified example of the support structure 40 supporting the wafer W.

Referring to FIG. 5C, a through opening portion 40d may extend internally in the ring body 44 from the upper surface 40U1 of the ring body 44, and may pass through at least a portion of the wafer support portion 46. For example, the angle or position of the through opening portion 40d may be different, as compared to the through opening portions 40a described with reference to FIGS. 1-3.

Figure 6:
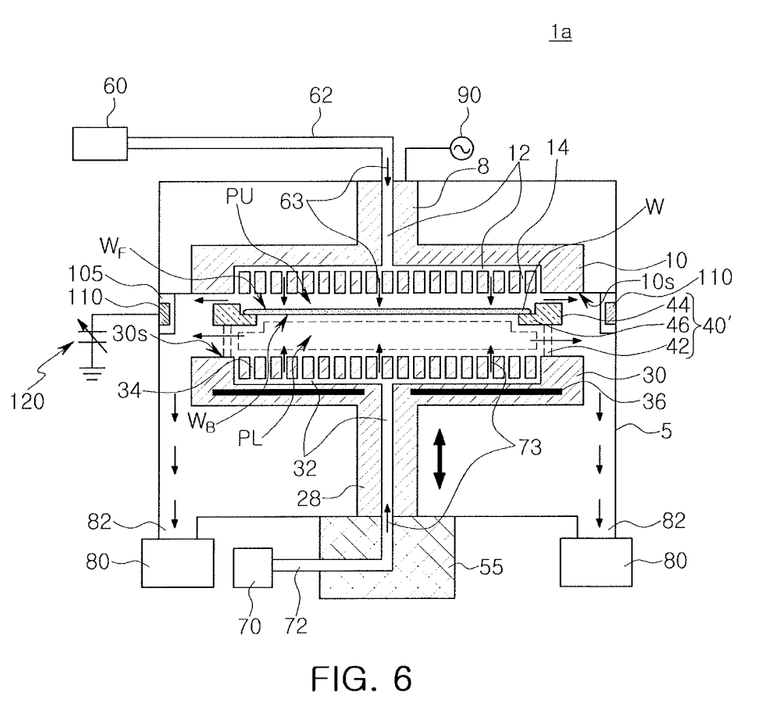
FIG. 6 illustrates a conceptual cross-sectional view of a modified example of a deposition apparatus, according to an example embodiment.

A modified example of the deposition apparatus 1a, according to an example embodiment, will be described with reference to FIG. 6. FIG. 6 is a schematic cross-sectional view illustrating the modified example of the deposition apparatus 1a, according to an example embodiment.

Referring to FIG. 6, the deposition apparatus 1a may include the process chamber 5, the upper shower head 10, the lower shower head 30, the upper gas supply part 60, the upper gas pipe 62, the lower gas supply part 70, the lower gas pipe 72, and the RF power supply part 90, as described above.

The deposition apparatus 1 may further include a support structure 40' disposed between the upper shower head 10 and the lower shower head 30. The support structure 40a may couple to the lower shower head 30, and may be spaced apart from the upper shower head 10. The support structure 40 may include the ring body 44 surrounding the wafer W, the plurality of ring support shafts 42 extending downwardly from the ring body 44 to connect to the lower shower head 30, and the wafer support portion 46 extending from a lower region of the ring body in a direction internal within the ring body 44 to support the wafer W.

The deposition apparatus 1a, according to an example embodiment, may further include a metal ring 110 electrically connected to a variable capacitor 120, which may change the capacitance. In an example, the variable capacitor 120 may be disposed externally with respect to the process chamber 5.

In an example, the metal ring 110 may be isolated from an internal space of the process chamber 5 by a dielectric 105, e.g., quartz. The dielectric 105 may be disposed on a wall, e.g., an inner wall, of the process chamber 5. The dielectric 105 may isolate the internal, e.g., empty, space of the process chamber 5 from the metal ring 110, while covering the metal ring 110. The dielectric 105 may be spaced apart from the support structure 40.

The metal ring 110 may be spaced apart from the support structure 40', while surrounding at least a portion of the support structure 40'. In an example, the metal ring 110 may be spaced apart from the support structure 40', while surrounding the ring body 44 of the support structure 40'.

The metal ring 110 electrically connected to the variable capacitor 120 may prevent plasma generated in the plasma process region PL from being formed externally of the ring body 44 of the support structure 40'. Thus, the metal ring 110 may prevent plasma generated in the plasma process region PL from being formed on the front surface $W_F$ of the wafer W along an external surface of the ring body 44.

Figure 7:
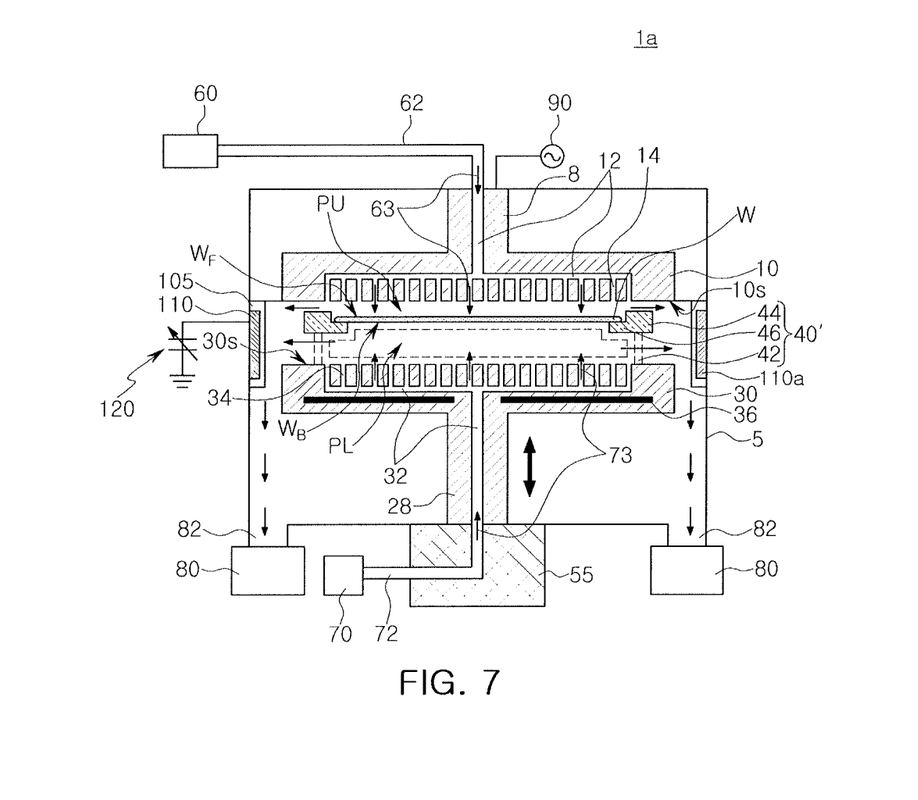
FIG. 7 illustrates a conceptual cross-sectional view of a modified example of a deposition apparatus, according to an example embodiment.

A modified example of the metal ring will be described with reference to FIG. 7. FIG. 7 is a schematic cross-sectional view illustrating a modified example of the deposition apparatus 1a, according to an example embodiment, to illustrate the modified example of the metal ring.

Referring to FIG. 7, a metal ring 110a electrically connected to the variable capacitor 120, as described above with reference to FIG. 6, may be positioned along sidewalls of the process chamber 5. The metal ring 110a may surround, e.g., at least partially overlap, the plasma process region PL, while surrounding, e.g., at least partially overlapping, the ring body 44 of the support structure 40'.

Referring again to FIG. 6 or 7, the ring body 44 of the support structure 40' may have a bulk shape without a through opening portion. However, example embodiments are not limited thereto.

For example, the ring body 44 may be modified such that the ring body 44 may include the same through opening portions as those described above with reference to FIGS. 1 through 5C. A modified example of a deposition apparatus 1b, including the support structure 40 having the ring body 44, as described above, will be described with reference to FIG. 8.

Figure 8:
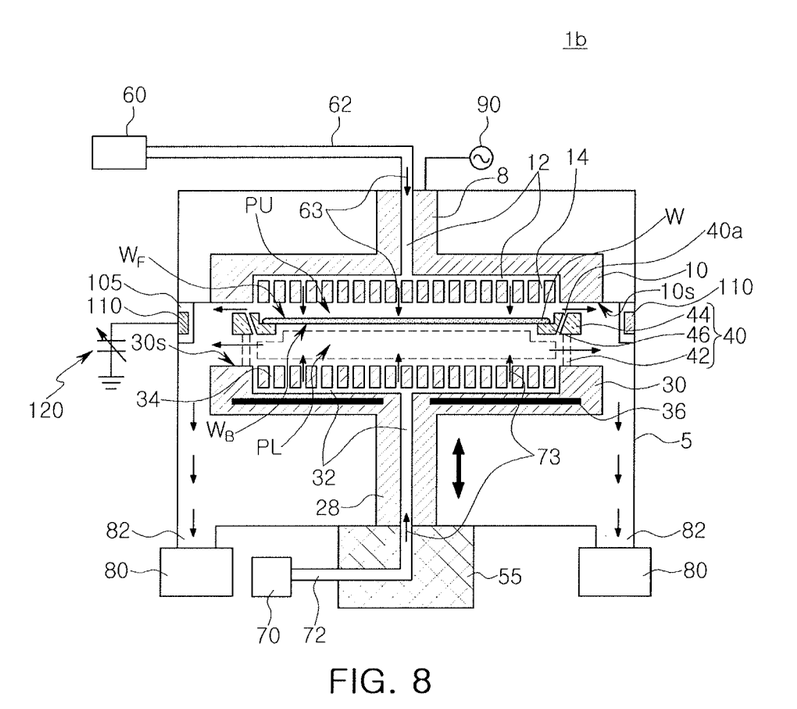
FIG. 8 illustrates a conceptual cross-sectional view of a modified example of a deposition apparatus, according to an example embodiment.

Referring to FIG. 8, the deposition apparatus 1b may include the support structure 40 including the through opening portions the same as those described above with reference to FIGS. 1 through 5C, together with the metal ring 110 electrically connected to the variable capacitor 120 the same as that described above with reference to FIG. 6 or 7. Since the through opening portions 40a have been described above with reference to FIGS. 1 through 5C, detailed descriptions thereof will be omitted herein.

Referring again to FIG. 1, the lower shower head 30 may have a lower heater 36 disposed therewithin. The lower heater 36 may adjust a process temperature of the plasma process region PL. Thus, the deposition apparatus 1, according to an example embodiment, may adjust the process temperature, using the lower heater 36. However, example embodiments are not limited thereto.

Figure 9:
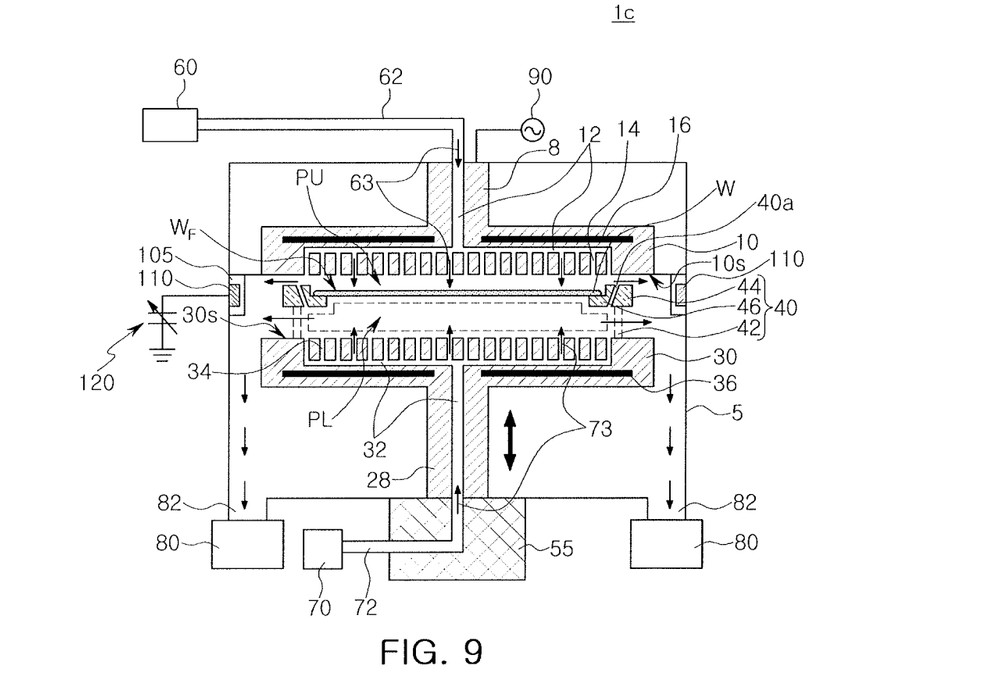
FIG. 9 illustrates a conceptual cross-sectional view of a modified example of a deposition apparatus, according to an example embodiment.

A modified example of the lower heater 36 will be described with reference to FIG. 9. FIG. 9 is a conceptual perspective view illustrating a modified example of the deposition apparatus 1, according to an example embodiment.

Referring to FIG. 9, a deposition apparatus 1c, according to an example embodiment, may adjust the process temperature, using an upper heater 16 disposed within the upper shower head 10, together with the lower heater 36 disposed within the lower shower head 30. Further, the deposition apparatus 1c may further include the support structure 40 or 40' and/or the metal ring 110 or 110a having the variable capacitor 120.

The support structure 40 or 40' and the metal ring 110 or 110a may prevent an undesired film from being deposited onto the front surface $W_F$ of the wafer W, while the rear reinforcing film 100b is formed on the rear surface $W_B$ of the wafer W to significantly reduce the warpage phenomenon of the wafer W. Thus, the support structure 40 or 40' and the metal ring 110 or 110a, having the variable capacitor 120, may serve to protect the front surface $W_F$ of the wafer W from plasma used to form the rear reinforcing film 100b on the rear surface $W_B$ of the wafer W.

By way of summation and review, as the semiconductor fabrication processes for forming ICs proceed, front patterns may be formed to a uniform thickness on a front surface of a semiconductor wafer. However, stress generated by such front patterns may cause a bowing phenomenon in which the semiconductor wafer may be warped.

In contrast, an aspect of the present disclosure provides a deposition apparatus that may perform a deposition process on a rear surface of a semiconductor wafer. An aspect of the present disclosure also provides a deposition apparatus including an upper shower head and a lower shower head.

That is, according to example embodiments, a deposition apparatus including an upper shower head and a lower shower head may be provided. The deposition apparatus may protect a front surface of a wafer from a plasma process, while forming a rear reinforcing film on a rear surface of the wafer by the plasma process. Thus, the deposition apparatus may form on the rear surface of the wafer the rear reinforcing film for significantly reducing a bowing phenomenon, e.g., warpage of the wafer, while preventing pollution of, or damage to, the front surface of the wafer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A deposition apparatus, comprising:
an upper shower head and a lower shower head within a process chamber, a lower surface of the upper shower head and an uppermost surface of the lower shower head facing each other;
a support structure between the upper shower head and the lower shower head to support a wafer, the support structure including a ring body to surround the wafer, and a lower surface of the ring body being connected to the lower shower head; and
a plasma process region between the wafer supported by the support structure and the lower shower head, the plasma process region being in direct fluid communication with the lower surface of the ring body,
wherein the lower shower head includes lower holes to jet a lower gas in a direction of the wafer,
wherein the upper shower head includes upper holes to jet an upper gas in a direction of the wafer,
wherein the support structure includes through opening portions passing through the ring body, the through opening portions extending between an upper surface of the ring body and the lower surface of the ring body, an entirety of each of the through opening portions extending at an obtuse angle with respect to the lower surface of the ring body from the upper surface of the ring body to the lower surface of the ring body, a bottom of each of the through opening portions being in direct fluid communication with the plasma process region and facing the lower shower head to discharge a portion of the lower gas jetted through the lower holes to a space between the support structure and the upper shower head,
wherein the uppermost surface of the lower shower head is flat, and
wherein the uppermost surface of the lower shower head vertically overlaps the lower surface of the ring body and the wafer supported by the support structure.

2. The deposition apparatus of claim 1, wherein the support structure further includes:
a plurality of ring support shafts extending downwardly from the ring body and connected to the lower shower head, the plurality of ring support shafts being external to the ring body; and
a wafer support portion extending from a lower region of the ring body toward a center of the ring body to support the wafer,
wherein an outer lateral surface of the ring body vertically overlaps the uppermost surface of the lower shower head,
wherein the plurality of ring support shafts directly contacts the uppermost surface of the lower shower head, and
wherein the lower surface of the ring body and a lower surface of the wafer support portion are coplanar with each other.

3. The deposition apparatus of claim 2, wherein the plurality of ring support shafts extends in its entirety between the lower surface of the ring body and the uppermost surface of the lower shower head, the plurality of ring support shafts defining a space between the lower surface of the ring body and the uppermost surface of the lower shower head for the plasma process region.

4. The deposition apparatus of claim 1, wherein portions of the through opening portions passing through the upper surface of the ring body are closer to an outer surface of the ring body than to portions of the through opening portions passing through the lower surface of the ring body.

5. The deposition apparatus of claim 1, wherein a distance between the through opening portions and an outer surface of the ring body along the upper surface of the ring body is smaller than a distance between the through opening portions and the outer surface of the ring body along the lower surface of the ring body, the lower surface of the ring body facing the lower shower head.

6. The deposition apparatus of claim 1, wherein the support structure further includes:
a plurality of ring support shafts extending downwardly from the ring body and connected to the lower shower head; and
a wafer support portion extending from a lower region of the ring body toward a center of the ring body to support the wafer, the through opening portions of the support structure extending internally in the ring body from the upper surface of the ring body, and passing through at least a portion of the wafer support portion,
wherein the lower surface of the ring body and a lower surface of the wafer support portion are coplanar with each other, and
wherein the lower surface of the ring body and the lower surface of the wafer support portion are flat.

7. The deposition apparatus of claim 1, further comprising:
a metal ring within a dielectric disposed on an inner wall of the process chamber, the dielectric isolating the metal ring from an empty space of the process chamber; and
a variable capacitor electrically connected to the metal ring, the variable capacitor being external with respect to the process chamber.

8. The deposition apparatus of claim 1, wherein the support structure is closer to the upper shower head than to the lower shower head.

9. The deposition apparatus of claim 1, further comprising:
an upper gas supply part to supply the upper gas, the upper gas including a purge gas; and
a lower gas supply part to supply the lower gas, the lower gas including a plasma process source gas.

10. The deposition apparatus of claim 1, further comprising a discharge portion on a lower portion of the process chamber, the discharge portion being lower than the lower shower head to discharge the upper gas and the lower gas.

11. The deposition apparatus of claim 1, further comprising a lower heater within the lower shower head.

12. The deposition apparatus of claim 1, further comprising an upper heater within the upper shower head.

13. A deposition apparatus, comprising:
a lower shower head having an uppermost surface;
an upper shower head facing the lower shower head;
a support structure between the upper shower head and the lower shower head to support a wafer, the support structure including a ring body to surround a sidewall of the wafer;
a plasma process region between the wafer supported by the support structure and the lower shower head;
a first opening space between an upper surface of the ring body and a lower surface of the upper shower head; and a second opening space between a lower surface of the ring body and the uppermost surface of the lower shower head, wherein the lower surface of the ring body vertically overlaps the uppermost surface of the lower shower head, wherein the lower shower head includes lower holes to jet a plasma process source gas in a direction of the wafer, wherein the upper shower head includes upper holes to jet a purge gas in a direction of the wafer, wherein the wafer includes a front pattern including a semiconductor integrated circuit, wherein the front pattern of the wafer supported by the support structure faces the upper shower head, wherein the support structure further includes:
   through opening portions passing through the ring body,
   a plurality of ring support shafts extending downwardly from the ring body and connected to the lower shower head, and
   a wafer support portion extending from a lower region of the ring body toward a center of the ring body to support the wafer, wherein the through opening portions extend between the upper surface of the ring body and the lower surface of the ring body to discharge a portion of the plasma process source gas jetted through the lower holes into the first opening space, wherein the uppermost surface of the lower shower head is flat, wherein an outer diameter of the uppermost surface of the lower shower head is greater than an outer diameter of the ring body, wherein the outer diameter of the ring body is greater than a diameter of the wafer, and wherein each of the through opening portion includes an upper end opening facing the lower surface of the upper shower head and a lower end opening facing the lower shower head, wherein the lower surface of the ring body and a lower surface of the wafer support portion are coplanar with each other, and wherein the lower surface of the ring body and the lower surface of the wafer support portion are flat.

14. The deposition apparatus of claim 13,
wherein portions of the through opening portions passing through the upper surface of the ring body are closer to an outer lateral surface of the ring body than to portions of the through opening portions passing through the lower surface of the ring body, and wherein the outer lateral surface of the ring body vertically overlaps the uppermost surface of the lower shower head.

15. The deposition apparatus of claim 13,
wherein the through opening portions of the support structure extend internally through the ring body from the upper surface of the ring body, the through opening portions passing through at least a portion of the wafer support portion, and wherein portions of the through opening portions passing through the upper surface of the ring body are closer to an outer surface of the ring body than to portions of the through opening portions passing through the lower surface of the ring body.

16. The deposition apparatus of claim 13, further comprising:
   a metal ring surrounding the support structure, the metal ring being spaced apart from the support structure; and
   a variable capacitor electrically connected to the metal ring.

17. A deposition apparatus, comprising:
   a lower shower head having an uppermost surface and within a process chamber;
   an upper shower head within the process chamber, a lower surface of the upper shower head facing the uppermost surface of the lower shower head;
   a support structure between the upper shower head and the lower shower head to support a wafer, the support structure including a ring body to surround a sidewall of the wafer;
   a plasma process region between the wafer supported by the support structure and the lower shower head;
   a first opening space between an upper surface of the ring body and the lower surface of the upper shower head; and
   a second opening space between a lower surface of the ring body and the uppermost surface of the lower shower head, wherein the lower shower head includes lower holes to jet a lower gas in a direction of the wafer, wherein the upper shower head includes upper holes to jet an upper gas in a direction of the wafer, and wherein the support structure further includes:
   a through opening portion passing through the ring body,
   a plurality of ring support shafts extending downwardly from the ring body and connected to the lower shower head, and
   a wafer support portion extending from a lower region of the ring body toward a center of the ring body to support the wafer, wherein the ring body includes an outer lateral surface facing an inner wall of the process chamber and an inner lateral surface facing the sidewall of the wafer, wherein the ring body includes an upper surface facing the lower surface of the upper shower head and a lower surface facing the uppermost surface of the lower shower head, wherein the through opening portion extends between the upper surface of the ring body and the lower surface of the ring body, wherein the through opening portion includes an upper end opening facing the lower surface of the upper shower head and a lower end opening facing the lower shower head, wherein a distance between the upper end opening of the through opening portion and a center axis of the ring body is greater than a distance between the lower end opening of the through opening portion and the center axis of the ring body, wherein the uppermost surface of the lower shower head is flat, and wherein an outer diameter of the uppermost surface of the lower shower head is greater than an outer diameter of the ring body.

18. The deposition apparatus of claim 17, further comprising:
   a metal ring on the inner wall of the process chamber; and
   a variable capacitor electrically connected to the metal ring, wherein the metal ring surrounds at least a portion of the support structure, the variable capacitor being external with respect to the process chamber.

19. The deposition apparatus of claim 17, wherein the outer lateral surface of the ring body vertically overlaps the uppermost surface of the lower shower head.

20. The deposition apparatus of claim 13, wherein the lower surface of the ring body vertically overlaps the uppermost surface of the lower shower head and tops of at least some of the lower holes of the lower shower head.

* * * * *